US012362767B2

(12) United States Patent
Harel et al.

(10) Patent No.: US 12,362,767 B2
(45) Date of Patent: Jul. 15, 2025

(54) DIGITAL SIGNAL SYMBOL DECISION GENERATION WITH CORRESPONDING FORNEY-BASED CONFIDENCE LEVEL

(71) Applicant: Mellanox Technologies, Ltd., Yokneam (IL)

(72) Inventors: Oz Harel, Ness Ziona (IL); Hananel Faig, Jerusalem (IL); Yair Yakoby, Modi'in (IL)

(73) Assignee: Mellanox Technologies, Ltd., Yokneam (IL)

( * ) Notice: Subject to any disclaimer, the term of this patent is extended or adjusted under 35 U.S.C. 154(b) by 114 days.

(21) Appl. No.: 18/141,757

(22) Filed: May 1, 2023

(65) Prior Publication Data

US 2024/0372565 A1 Nov. 7, 2024

(51) Int. Cl.
*H03M 13/15* (2006.01)
*H03M 13/00* (2006.01)
*H03M 13/11* (2006.01)

(52) U.S. Cl.
CPC ..... *H03M 13/154* (2013.01); *H03M 13/1125* (2013.01)

(58) Field of Classification Search
CPC .................. H03M 13/154; H03M 13/1125
See application file for complete search history.

(56) References Cited

U.S. PATENT DOCUMENTS

| 8,559,498 | B1 * | 10/2013 | Eliaz | H04L 1/005 |
| | | | | 375/233 |
| 9,166,623 | B1 * | 10/2015 | Bates | H03M 13/1555 |
| 11,582,073 | B1 * | 2/2023 | Dabbagh | H04L 25/03146 |
| 11,855,658 | B1 * | 12/2023 | Berman | H03M 13/1515 |

* cited by examiner

*Primary Examiner* — Justin R Knapp
(74) *Attorney, Agent, or Firm* — Lowenstein Sandler LLP

(57) ABSTRACT

A receiver including an equalization component to receive a signal comprising a sequence of samples corresponding to symbols and generate an equalized signal with an estimated sequence of symbols corresponding to the signal. The receiver further includes a decision generation component to detect that an aggregate error level associated with the equalized signal exceeds a saturation threshold level. The decision generation component identifies a set of errors including a first error associated with a first symbol having a highest error level and a last error associated with a last symbol. The decision generation component generates, based on the equalized signal, a decision including a sequence of one or more bits that represent each symbol of a first subset of the sequence of symbols and a confidence level corresponding to the decision, where the confidence level is based at least in part on a distance between an error level of each symbol and a level of the first error.

17 Claims, 9 Drawing Sheets

DIGITAL SIGNAL SYMBOL DECISION GENERATION WITH CORRESPONDING FORNEY-BASED CONFIDENCE LEVEL

TECHNICAL FIELD

At least one embodiment pertains to processing resources used to perform high-speed communications. For example, at least one embodiment pertains to technology to generate hard-decision symbol estimation and soft-decision estimation using a Forney algorithm to produce a confidence level or certainty corresponding to each of the hard-decision symbol estimates.

BACKGROUND

Communications systems transmit and receive signals at a high data rate (e.g., up to 400 Gbits/sec). Increasing rates of data transfer in a communication channel result in a higher level of insertion loss (IL). For example, in some communication channels, the insertion loss can be as high as −70 dB at the Nyquist frequency. To overcome the problems associated with high IL channels, a typical equalization scheme is employed, which is targeted to a high-order partial response (PR), such as, for example, a PR1 (1+D) response or a PR2 (1+2D+$D^2$) response (where D is a delay). These higher-order partial responses require a narrower bandwidth (BW) and achieve better Bit Error Rate (BER) results.

In some communication systems, an equalization component is employed (e.g., a Feed-Forward Equalizer (FFE) or Maximum Likelihood Sequences Estimator (MLSE)) to provide optimized equalization of time variations in the propagation channel characteristics and achieve the advantages of the partial response and reach the desired BER results. For example, the MLSE can be implemented by a Viterbi algorithm (e.g., an algorithm to obtain maximum a posteriori probability estimates of a most likely sequence of hidden states that results in a sequence of observed events) and use the partial response equalization output to decode hard-decision symbols. In some systems, the hard-decision decoded symbols are passed to a hard-decision forward error correction (FEC). In some protocols, a differential precoder is used before the hard-decision FEC to reduce burst error effects.

In order to achieve the target BER results, some systems employ inner or outer soft-decision FEC schemes, in addition to the high order of PR responses. For example, a soft-decision FEC scheme can be employed, which uses a soft input for each decoded symbol which provides a confidence level or certainty associated with the corresponding decoded symbol. In some systems, the soft-decision FEC scheme uses the certainty information (e.g., the soft-decision output) to improve the BER performance, as compared with the hard-decision FEC schemes (e.g., a BER improvement represented by a number of dBs in the system's signal-to-noise ratio (SNR) as represented in a corresponding BER-SNR relationship curve).

To benefit from the two schemes described above (e.g., high-order PR target MLSE together with soft inner or outer FEC), a soft-decision output MLSE is needed. However, typical soft-decision MLSE algorithms, such as the "Soft Output Viterbi Algorithm" (SOVA), are extremely complicated to implement in a high-speed architecture. These complications render such approaches as cost-prohibitive for use in a high-speed communication system.

Other MLSE architectures can be implemented that employ the Forney algorithm to calculate error values at known error locations of a received signal for generating only a hard-decision output. However, this approach fails to produce a soft-decision estimation or confidence level corresponding to the hard-decision symbol determinations.

Accordingly, there is a need for a cost-effective and efficient approach to enable the generation of hard-decision estimations relating to a set of symbols of a received signal along with a Forney-based soft-decision approximation of a certainty or confidence level associated with each hard-decision estimation.

BRIEF DESCRIPTION OF DRAWINGS

Various embodiments in accordance with the present disclosure will be described with reference to the drawings, in which.

DETAILED DESCRIPTION

Figure 1A:
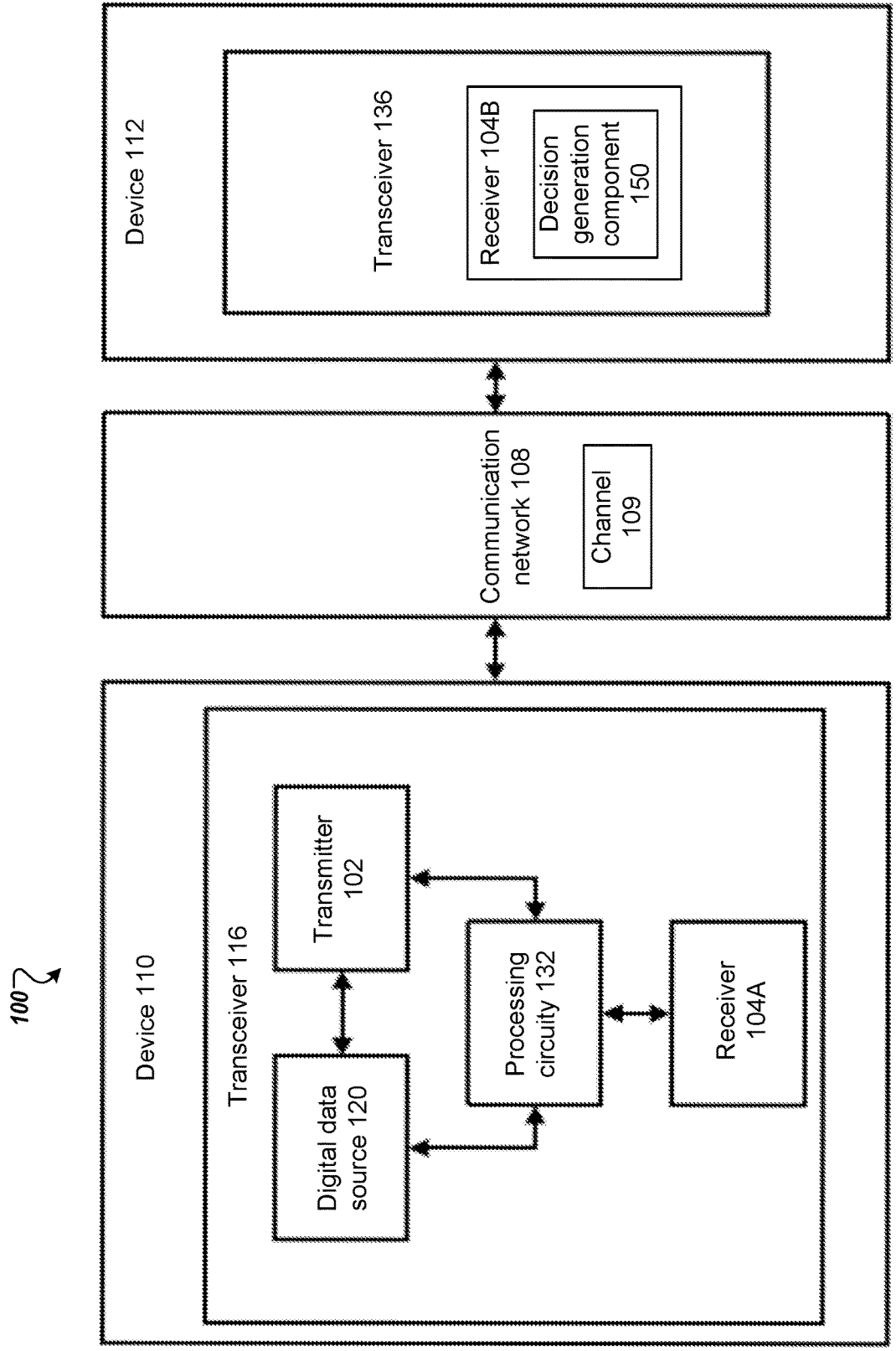
FIG. 1A illustrates an example communication system, in accordance with at least some embodiments.

As described above, various types of decoding of a high-speed digital signal received by a receiver in a communication system may be needed. For example, typical soft-decision MLSE-based approaches may be used to address high insertion loss levels associated with high-speed baud and data rates. However, common approaches (e.g., the Soft Output Viterbi Algorithm) fail to provide both low-cost and reliable hard-decision decoding with a corresponding soft-decision output for each of the hard-decision symbols or bits.

Advantageously, aspects of the present disclosure are directed to a decision generation component to implement a Forney algorithm to detect error data associated with one or more samples of a received signal and use the error data to generate soft MLSE decision values, also referred to as a "Forney-based soft MLSE," configured for implementation in a digital signal receiver. In an embodiment, the decision generation component generates hard-decision estimations (e.g., symbols or bits) relating to a received digital signal. In addition, the decision generation component executes a Forney algorithm to identify error data and, based on the error data, generate a confidence level or certainty for each of generated hard-decision estimations (e.g., each symbol or bit). In an embodiment, the confidence level can be a log-likelihood ratio (LLR) or an approximation of the log probabilities of the LLR for each hard-decision estimation. Accordingly, the decision generation component decodes the received digital signal to determine a hard-decision estimation (e.g., a fixed set of possible values such as "0" or "1" in binary code) corresponding to samples of the received digital signal. In addition, the decision generation component performs soft decision decoding to generate a confidence level (e.g., a number in a range of values) that indicates a reliability or certainty for each hard-decision estimation (e.g., each symbol/bit), where the confidence level is based on error data generated using the Forney algorithm.

In an embodiment, the decision generation component can implement a Forney-based soft MLSE algorithm for use in an inner or outer serializer/deserializer (SerDes) soft FEC receiver scheme. According to aspects of the present disclosure, the decision generation component can be implemented in a high-speed SerDes having a digital clock rate that is lower compared to the baud rate. The digital receiver can employ parallel hardware (HW) to enable parallel processing of the symbols. Accordingly, the decision generation component can execute the Forney-based soft MLSE algorithm or processing on a block of symbols (e.g., a group of some symbols), as compared to the symbol-by-symbol processing of some typical systems.

In an embodiment, a decision generation component (i.e., a decision feedback equalizer (DFE)) executes a Forney algorithm to detect that an aggregate error level associated with an equalized signal with an estimated sequence of symbols corresponding to a received signal exceeds a saturation threshold level. The decision-generation component employs the Forney algorithm to identify a set of errors associated with a set of symbols of the equalized signal. The decision generation component identifies a first error associated with a first symbol that has a highest relative error level of the error levels of the set of errors. The decision generation component further identifies a last error associated with a last symbol of the set of symbols (e.g., a symbol corresponding to a location where the aggregate error level reaches and exceeds the error saturation level).

In this embodiment, the decision generation component generates, based on the equalized signal, a decision (e.g., a hard-decision estimation) including a sequence of one or more bits that represent each symbol of a first subset of the sequence of symbols and a confidence level (e.g., a soft decision) corresponding to the decision, where the confidence level is based at least in part on a distance between an error level of each symbol and the (highest relative) error level of the first error. For example, a confidence level associated with a particular symbol having an identified error level within the sequence of the set of errors (also referred to as an "error chunk"), and the having is based on a distance between the identified error level and the highest relative error level of the first error.

In this embodiment, the decision generation component includes a data detector (e.g., a slicer circuit) to determine if an aggregate error level associated with the set of errors reaches an error saturation level. In an embodiment, the burst or set of errors is stopped when the aggregate error level reaches the saturation point due to a single error. In an embodiment, in response to reaching the error saturation level, the Forney-based decision generation component executes a Forney algorithm to identify a subset of the sequence of symbols associated with the valid errors (e.g., the identified locations of valid errors). In an embodiment, the Forney-based decision generation component executes the Forney algorithm to identify a second subset of the sequence of symbols associated with invalid errors. In an embodiment, the decision generation component identifies the locations of the invalid errors, and those invalid errors are dropped or discarded and not included in the subset of valid errors. In an embodiment, the confidence level associated with the subset of valid errors is determined based on the respective distances from the location of the error having the highest error level.

In another embodiment, the aggregate error level may not reach the error saturation level. For example, the aggregate error level may not be reached if, in a first scenario, there are no errors associated with the set of symbols or, in a second scenario, there are two or more errors in a same direction that occur before saturation. In an embodiment, given the second scenario in which no saturation occurs, the decision generation component determines a first probability that the equalized signal includes two or more errors (also referred to as "$P_{2\ errors}$"). In this embodiment, the decision generation component further determines a second probability that the equalized signal includes zero or no errors (also referred to as "$P_{no\ errors}$"). In this embodiment, the confidence level (e.g., the LLR value) associated with the hard-decision estimation is determined by the decision generation component based on a comparison of the first probability and the second probability. In an embodiment, the confidence level is determined based on a difference between the first probability and the second probability.

According to embodiments, the processing performed by the decision generation component can be implemented for any modulation scheme (e.g., PAM or quadrature amplitude modulation (QAM), etc. schemes). For example, embodiments described herein include examples using PAM2/PAM4 modulation.

Advantageously, the decision generation component can be implemented as a cost-efficient design for a high-speed receiver to calculate a soft decision (i.e., a confidence level) using a Forney error detection algorithm. In an embodiment, the confidence level includes a state's log-likelihood probabilities vector for each input sample and transforms the state's log-likelihood probabilities vector to the symbol's log-likelihood probabilities vector. The processing results in the generation of a hard-decision estimation, including a sequence of one or more bits that represent each symbol of a sequence of symbols corresponding to samples of the received signal and a confidence level based on the Forney algorithm that corresponds to each of the generated hard-decision estimations.

FIG. 1A illustrates an example communication system 100 according to at least one example embodiment. The system 100 includes a device 110, a communication network 108 including a communication channel 109, and a device 112. In at least one example embodiment, devices 110 and 112 correspond to one or more of a Personal Computer (PC), a laptop, a tablet, a smartphone, a server, a collection of servers, or the like. In some embodiments, the devices 110 and 112 may correspond to any appropriate type of device that communicates with other devices also connected to a common type of communication network 108. According to embodiments, the receiver 104A, 104B of devices 110 or 112 may correspond to a graphics processing unit (GPU), a switch (e.g., a high-speed network switch), a network adapter, a central processing unit (CPU), etc. As another specific but non-limiting example, the devices 110 and 112 may correspond to servers offering information resources, services and/or applications to user devices, client devices, or other hosts in the system 100.

Examples of the communication network 108 that may be used to connect the devices 110 and 112 include an Internet Protocol (IP) network, an Ethernet network, an InfiniBand (IB) network, a Fibre Channel network, the Internet, a cellular communication network, a wireless communication network, combinations thereof (e.g., Fibre Channel over Ethernet), variants thereof, and/or the like. In one specific, but non-limiting example, the communication network 108 is a network that enables data transmission between the devices 110 and 112 using data signals (e.g., digital, optical, wireless signals).

The device 110 includes a transceiver 116 for sending and receiving signals, for example, data signals. The data signals may be digital or optical signals modulated with data or other suitable signals for carrying data.

The transceiver 116 may include a digital data source 120, a transmitter 102, a receiver 104A, and processing circuitry 132 that controls the transceiver 116. The digital data source 120 may include suitable hardware and/or software for outputting data in a digital format (e.g., in binary code and/or thermometer code). The digital data output by the digital data source 120 may be retrieved from memory (not illustrated) or generated according to input (e.g., user input).

The transmitter 102 includes suitable software and/or hardware for receiving digital data from the digital data source 120 and outputting data signals according to the digital data for transmission over the communication network 108 to a receiver 104B of device 112. In an embodiment, the transmitter 102 includes a decision generation component 150. Additional details of the structure of the receiver 104B and decision generation component 150 are discussed in more detail below with reference to the figures.

The receiver 104A, 104B of device 110 and device 112 may include suitable hardware and/or software for receiving signals, for example, data signals from the communication network 108. For example, the receivers 104A, 104B may include components for receiving processing signals to extract the data for storing in a memory.

The processing circuitry 132 may comprise software, hardware, or a combination thereof. For example, the processing circuitry 132 may include a memory including executable instructions and a processor (e.g., a microprocessor) that executes the instructions on the memory. The memory may correspond to any suitable type of memory device or collection of memory devices configured to store instructions. Non-limiting examples of suitable memory devices that may be used include Flash memory, Random Access Memory (RAM), Read Only Memory (ROM), variants thereof, combinations thereof, or the like. In some embodiments, the memory and processor may be integrated into a common device (e.g., a microprocessor may include integrated memory). Additionally or alternatively, the processing circuitry 132 may comprise hardware, such as an application-specific integrated circuit (ASIC). Other non-limiting examples of the processing circuitry 132 include an Integrated Circuit (IC) chip, a Central Processing Unit (CPU), a General Processing Unit (GPU), a microprocessor, a Field Programmable Gate Array (FPGA), a collection of logic gates or transistors, resistors, capacitors, inductors, diodes, or the like. Some or all of the processing circuitry 132 may be provided on a Printed Circuit Board (PCB) or collection of PCBs. It should be appreciated that any appropriate type of electrical component or collection of electrical components may be suitable for inclusion in the processing circuitry 132. The processing circuitry 132 may send and/or receive signals to and/or from other elements of the transceiver 116 to control the overall operation of the transceiver 116.

The transceiver 116 or selected elements of the transceiver 116 may take the form of a pluggable card or controller for the device 110. For example, the transceiver 116 or selected elements of the transceiver 116 may be implemented on a network interface card (NIC).

The device 112 may include a transceiver 136 for sending and receiving signals, for example, data signals over a channel 109 of the communication network 108. The same or similar structure of the transceiver 116 may be applied to transceiver 136, and thus, the structure of transceiver 136 is not described separately.

Although not explicitly shown, it should be appreciated that devices 110 and 112 and the transceivers 116 and 136 may include other processing devices, storage devices, and/or communication interfaces generally associated with computing tasks, such as sending and receiving data.

Figure 1B:
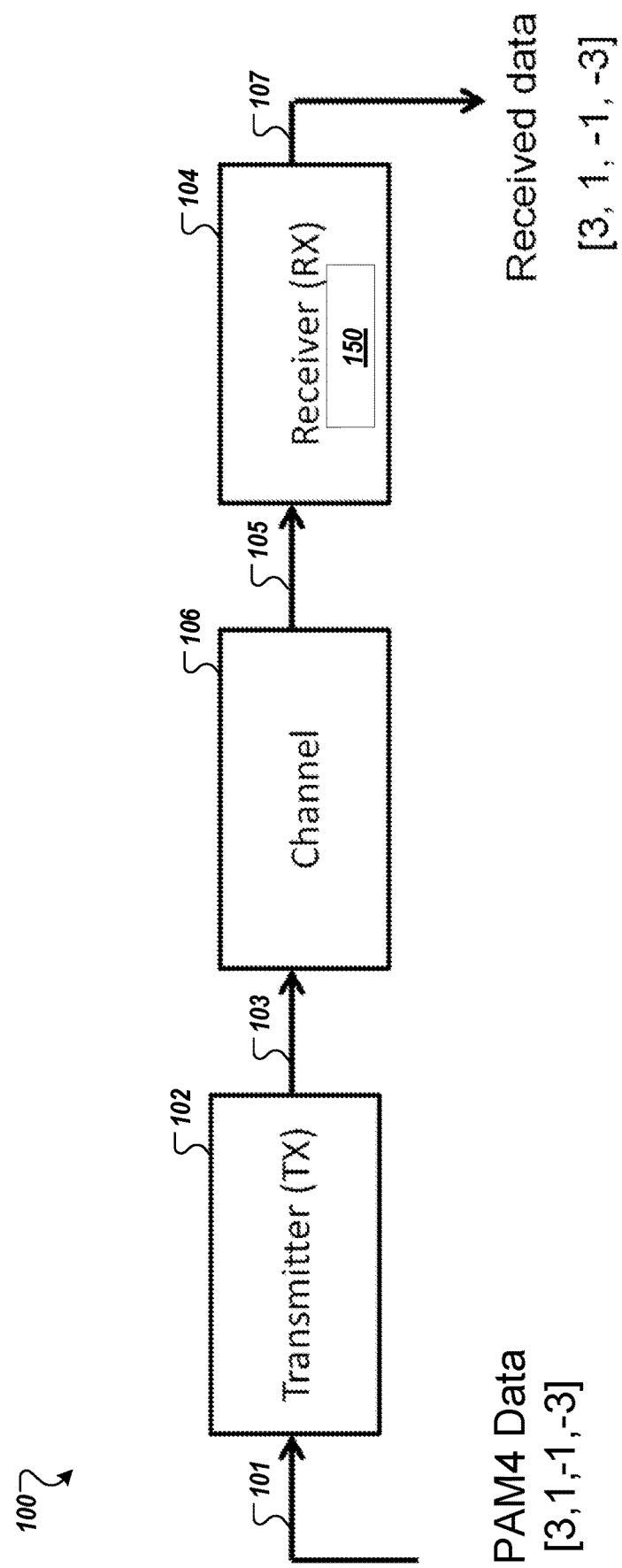
FIG. 1B illustrates a block diagram of an exemplary communication system employing an example modulation scheme, in accordance with at least some embodiments.

FIG. 1B illustrates a block diagram of an exemplary communication system 100 employing an example PAM modulation scheme. In the example shown in FIG. 1A, a PAM level-4 (PAM4) modulation scheme is employed with respect to the transmission of a signal (e.g., digitally encoded data) from a transmitter (TX) 102 to a receiver (RX) 104 via a communication channel 106 (e.g., a transmission medium). In this example, the transmitter 102 receives 101 an input data (i.e., the input data at time n is represented as "a(n)"), which is modulated in accordance with a modulation scheme (e.g., PAM4) and sends 103 the signal a(n) including a set of data symbols (e.g., symbols −3, −1, 1, 3, where the symbols represent coded binary data). It is noted that while the use of the PAM4 modulation scheme is described herein by way of example, other data modulation schemes can be used in accordance with embodiments of the present disclosure, including for example, a PAM2 modulation scheme, PAM8, PAM16,etc. For example, for a PAM2-based system, the transmitted data symbols consist of symbols −1 and 1, with each symbol value representing a binary bit. Typically a binary bit 0 is encoded as −1, and a bit 1 is encoded as 1 as the PAM2 values.

In the example shown, the PAM4 modulation scheme uses four (4) unique values of transmitted symbols to achieve higher efficiency and performance. The four levels are denoted by symbol values −3, −1, 1, 3, with each symbol representing a corresponding unique combination of binary bits (e.g., 00, 01, 10, 11 or 00, 01, 11, 10 while using Gray coding.

The communication channel 106 is a destructive medium in that the channel acts as a low pass filter which attenuates higher frequencies more than it attenuates lower frequencies and introduces inter-symbol interference (ISI). The communication channel 106 can be over serial links (e.g., a cable, printed circuit boards (PCBs) traces, copper cables, optical fibers, or the like), read channels for data storage (e.g., hard disk, flash solid-state drives (SSDs), high-speed serial links, deep space satellite communication channels, applications, or the like.

The receiver (RX) 104 includes a decision generation component 150, which is a circuit configured to generate a hard-decision estimation including a sequence of one or more bits that represent each symbol of a sequence of symbols corresponding to samples of the received signal (e.g., the "decision", "hard-decision estimation", or "hard decoded bits") and a confidence level corresponding to each of the generated hard-decision estimations (e.g., the "confidence level" or "soft decision") based on error data. According to embodiments, the decision generation component 150 performs Forney-based soft MLSE processing to generate the hard-decision estimations (e.g., hard decoded symbols/bits) and the corresponding soft decisions (e.g., confidence level for each hard-decision estimation) that are based on the error data generated by execution of the Forney algorithm, as described in greater detail herein.

Figure 1C:
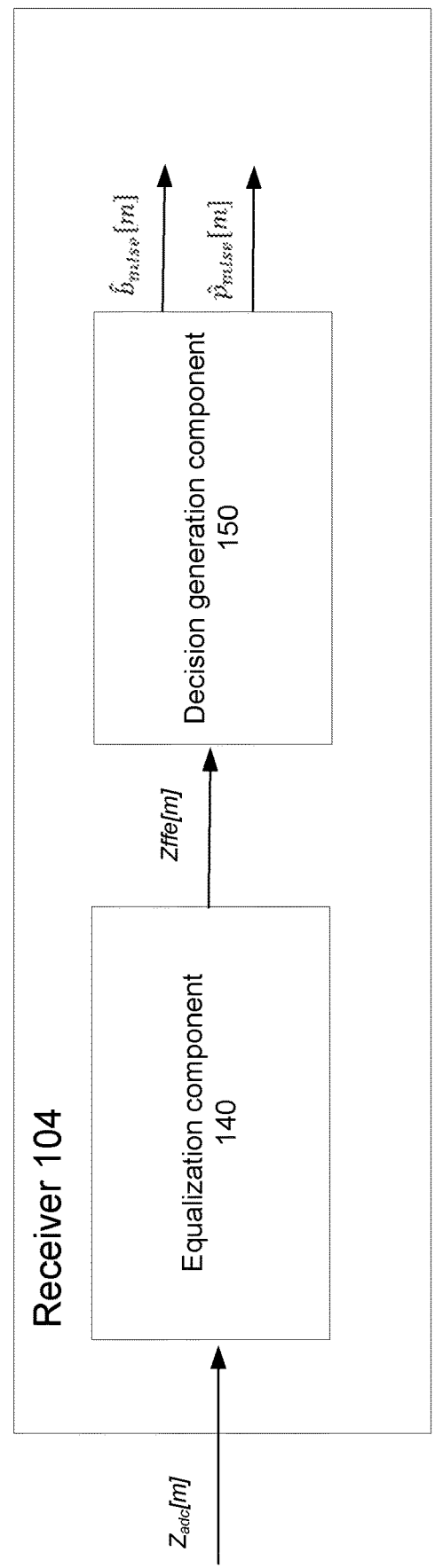
FIG. 1C illustrates a block diagram of an example receiver including an equalization component that receives input data and a decision generation component implementing Forney-based error correction to generate a hard decoded bit decision and corresponding confidence level associated with a received signal, in accordance with at least some embodiments.

FIG. 1C illustrates an example receiver 104 includes an equalization component 140 that receives input data ($z_{adc}$[m]) for each time instance 'm' and equalizes the input data to a partial response ($z_{ffe}$[m]), such as PR1. The output of the equalization ($z_{ffe}$[m]) is provided to a decision generation component 150 (e.g., a Forney-based soft MLSE component) to be decoded. In an embodiment, the decision generation component 250 receives the output ($z_{ffe}$[m]) of the equalization component 140 and generates hard-decoded bits ($\hat{b}_{mlse}$[m]) and a Forney-based soft decision confidence level or certainty signal ($\hat{P}_{mlse}$[m]), for each time sample 'm'. In an embodiment, the confidence level $\hat{P}_{mlse}$[m] is a log-likelihood ratio (LLR) which is represented as a positive number ≥0 to indicate a level of certainty that a current bit $\hat{b}_{mlse}$[m]=b, b ∈[0, 1], where higher numbers represent a higher level of confidence or certainty, and where 0 represents no certainty. In an embodiment, the confidence level or certainty signal is known as a bit Log-Likelihood Ratio (LLR), which is the log probability ratio of an approximation of a first probability that the current bit $\hat{b}_{mlse}$[m] equals "1" and an approximation of a second probability that the current bit $\hat{b}_{mlse}$[m] equals "0", or vice versa. For example, in a PAM2 system, the confidence level is determined based on an approximated first probability that the hard-decision estimation is "1" divided by an approximated second probability that the hard-decision estimation is "0", or vice versa. In an embodiment, the confidence level is represented by the LLR, which is a ratio of the approximated log probabilities corresponding to the hard-decision estimation values (e.g., "1" or "0" for a PAM2 system).

Figure 2:
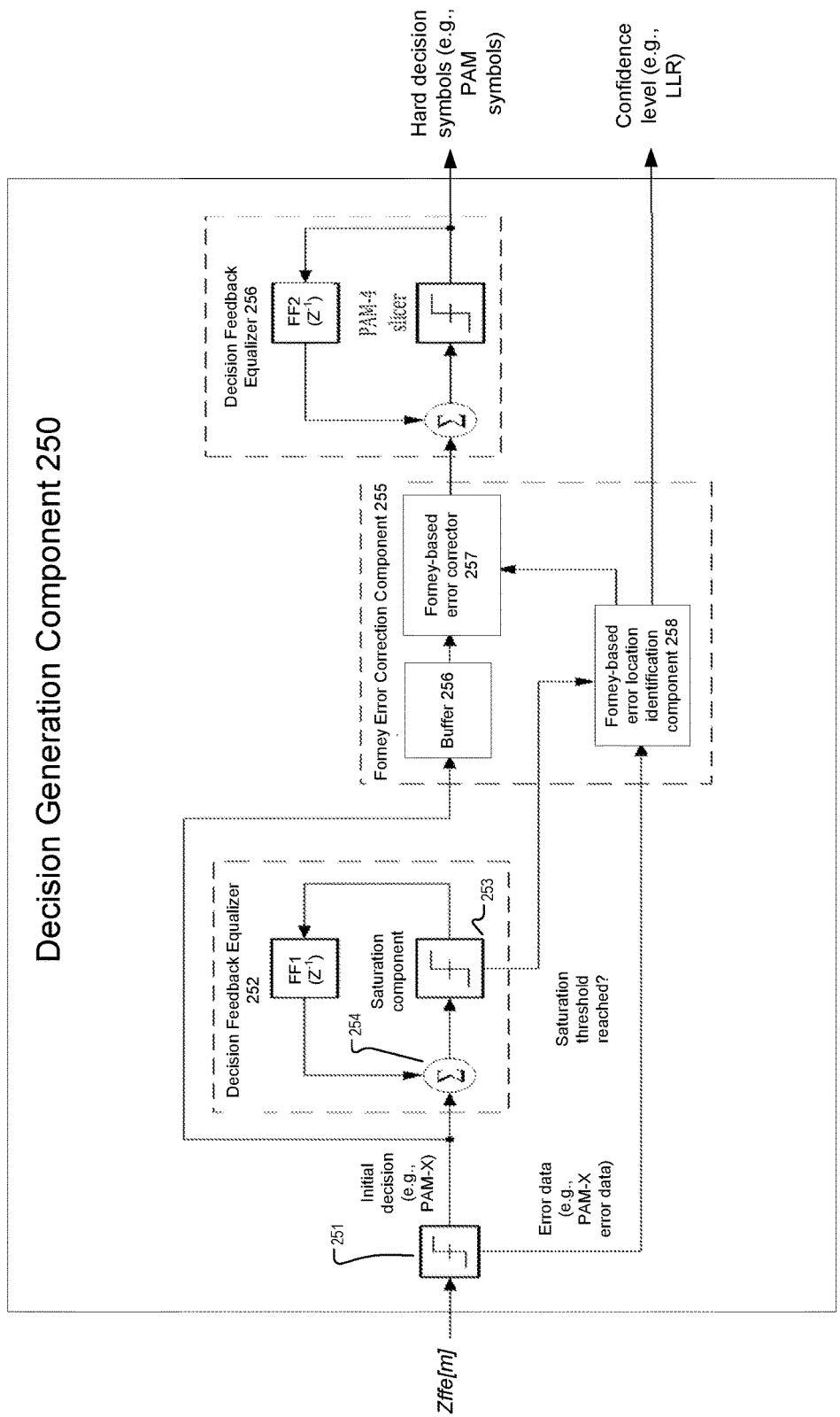
FIG. 2 illustrates an example receiver device including a decision generation component implementing Forney-based error correction to generate a hard decoded bit decision and a corresponding confidence level associated with a received signal, in accordance with at least some embodiments.

FIG. 2 illustrates an example decision generation component 250 including a Forney error correction component 255, according to embodiments of the present disclosure. As illustrated, the decision generation component 250 includes a first data detector 251 (e.g., a first slicer) to receive the equalized signal ($z_{ffe}$[m]) and generate an initial hard-decision estimation and error data. In an embodiment, the first data detector 251 can include a PAM-X slicer that takes the continuous-value data as an input and quantizes the data to an X value. For example, the PAM-X slicer can include a PAM-7 slicer that generates a PAM-7 decision that is provided to a first decision feedback equalizer (DFE) 252 and PAM-7 error data that is provided to the Forney error correction component 255. In an embodiment, the first decision feedback equalizer 252 (also referred to as a PR1 inverter) includes a first flip-flop (FF1) that generates a delay (e.g., a one unit-interval (UI) delay or $Z^{-1}$) corresponding to a filter tap when a feedback value is a particular value (e.g., −1). For example, if the symbol rate (e.g., 50-100 Gsample/sec) is higher than the digital clock rate (e.g., less than 10 GHz), some symbols may be processed in parallel. Therefore, in this example, the 1 sample delay is not implemented by the flip-flop, since the flip-flop is updated by the digital clock. Accordingly, in this example, a hardware implementation (e.g., a sample routing circuit) may be employed. In another example, for a lower data rate system, when the digital clock is high enough, 1 sample per digital clock can be processed using the UI delay generated by the flip-flop.

In an embodiment, the first DFE 252 includes a saturation component 253 to determine if an aggregate error level associated with the equalized signal exceeds a saturation threshold (e.g., a saturation point). In an embodiment, the saturation component 253 includes a PAM-Y slicer which takes the continuous-value data and quantizes the data to a Y value. In an embodiment, if the received signal is a PAM-4 signal (e.g., Y=4), the saturation component 253 is a PAM-4 slicer that employs a saturation threshold to cut or terminate the error propagation in the event of the presence of one or more errors. In an embodiment, the summation function 254 of DFE 252 performs a summation of the initial decision and the output of the first flip-flop FF1) (e.g., the one unit-interval (UI) delay or $Z^{-1}$). As illustrated, the saturation component 253 generates error data that includes a flag or other indicator that the aggregate error level exceeds the saturation point and provides that data to the Forney error correction component 255.

In an embodiment, the Forney error correction component 255 includes a buffer 256, a Forney-based error corrector 257, and a Forney-based error location identification component 258. In an embodiment, the buffer 256 provides a time delay to enable the Forney-based error corrector 257 to correct the initial decision (e.g., the PAM-X decision) in the event that errors causing the error burst are detected. In an embodiment, the Forney-based error location identification component 258 estimates a location of the set of errors in the error burst.

In an embodiment, the equivalent channel response (e.g., between the Tx and the MLSE input) is PR1, the expected ideal signal is PAM7 exactly. In an embodiment, an incorrect decision generated by the first slicer may be due to noise (e.g., crosstalk, jitter, thermal noise, etc.). However, the probability density function (PDF) of the noise is monotonic (e.g., the probability of generating a high noise value is lower than the probability of generating a low noise value). In an embodiment, the probability of generating a noise value which lead to 2 levels of errors is lower compared to the probability to generating a noise value which leads to 1 level of error. In an embodiment, if the noise is not strong enough (e.g., the signal-to-noise-ratio (SNR) is low), the probability for 2 levels of errors is negligible and can be avoided. In an embodiment, the error may be 1 level up or 1 level down, therefore the correction is employed to increase/decrease the relevant PAM-7 decision by one level.

In an embodiment, the Forney error correction component 255 identifies the error saturation indicator (e.g., a flag indicating the aggregate error level exceeds the saturation threshold) and determines if error correction is needed. In an embodiment, the Forney error correction component 255 identifies a set of errors associated with reaching the saturation threshold. In an embodiment, the set of errors is identified by determining a last symbol having a corresponding error level, where the last symbol corresponds to the saturation point (i.e., the last symbol of the sequence of symbols at which the aggregate error level exceeded the saturation threshold), as described in greater detail below with reference to FIGS. 3 and 5.

In an embodiment, the Forney error correction component 255 identifies one or more invalid errors in the set of errors. In an embodiment, since the channel response is PR1, the Forney error correction component 255 subtracts the previous decision to generate the current one. In an example, if saturation is reached with a positive value (e.g., for PAM4, the expected values are $-3, -1, 1, 3$ and negative saturation reaches 5), an over correction occurred. Accordingly, the previous value may be too positive (e.g., with error). For example, if the transmitter transmits '1', '−3', it is expected that the first slicer identifies '−2', and by subtracting the previous '1', the '−3' value is obtained. In another example, if there is an error on the previous decision, and the decision is '−3', a value of '−5' is obtained, which generates the correct decision of '−3' (e.g., the transmitted symbol) in view of the saturation. In an embodiment, the saturation direction indicates the previous error sign. The error sign over all previous samples is generated in a zig-zag pattern. Accordingly, if the error sign does not match the expected sign according to the aforementioned analysis, the error is identified as an 'invalid' error.

In an embodiment, a confidence level associated with symbols corresponding to the invalid errors is assumed to be high. The remaining errors in the set of errors of the error burst are identified as valid errors (e.g., an error having the expected sign). Accordingly, a subset of valid errors of the set of errors is identified by the Forney error correction component 255. In an embodiment, the subset of valid errors is sorted to generate a data detector error vector ($\bar{n}$) (also referred to as a "slicer error vector"), in accordance with the following expression:

$$\bar{n} = [n_0 \ldots n_I];$$

where $n_0$ represents the highest relative error level within the "chuck" or set of errors.

In an embodiment, the Forney error correction component 255 determines that error saturation has occurred based on the error data received from the saturation component 253 of DFE 252. In an embodiment, the Forney error correction component 255 determines a probability (p) that the error occurred initially in index i, in accordance with the following expression:

$$p_i = e^{-\frac{(d-n_i)^2}{2\sigma^2}} \cdot \prod_{\substack{k=0 \\ k \neq i}}^{I} e^{-\frac{n_k^2}{2\sigma^2}} = e^{-\frac{(d-n_i)^2 + \sum_{k=0, k \neq i}^{I} n_k^2}{2\sigma^2}};$$

where d represents a distance between two neighbor levels (e.g., the optional first slicer decision (e.g., for PAM4+PR1, PAM7 is used, which has 7 different levels (e.g., $-6, -4, -2, 0, 2, 4, 6$; where the distance is 2)), n represents a data detector (i.e., slicer) error level, k represents a product index run over all the vector's indices; e represents Euler's number; σ represents a standard deviation associated with the noise; and I represents a length of the error vector. A he optional first slicer decision (e.g. for PAM4+PR1 we expect to PAM7 so we have 7 different levels. For $-6, -4, -2, 0, 2, 4, 6$ the distance is 2)

In an embodiment, the Forney error correction component 255 generates a confidence level (e.g., LLR) for each hard-decision estimation symbol, in accordance with the following expression:

$$LLR_i = \log\left(\frac{p_i}{\sum_{\substack{n=0 \\ n \neq i}}^{I} p_n}\right)$$

$$LLR_0 = \left|\log\left(\frac{p_0}{\sum_{n=1}^{I} p_n}\right)\right| \approx \left|\log\left(\frac{p_0}{p_1 + o(p_2)}\right)\right| = \left|\log\left(\frac{p_0}{p_1}\right)\right|$$

$$LLR_0 = |\log(p_0) - \log(p_1)|$$

$$LLR_0 = |P_0 - P_1| = \left|-\left((d-n_0)^2 + \sum_{k=1}^{I} n_k^2\right) + \left((d-n_1)^2 + \sum_{k \neq 1}^{I} n_k^2\right)\right|$$

$$LLR_0 = 2d \cdot (n_0 - n_1)$$

$$LLR_i \atop i \neq 0 = \left|\log\left(\frac{p_i}{\sum_{n \neq 1}^{I} p_n}\right)\right| \approx \left|\log\left(\frac{p_i}{p_0 + o(p_k) \atop k \neq i, 0}\right)\right| = \left|\log\left(\frac{p_i}{p_0}\right)\right|$$

$$LLR_i \atop i \neq 0 = 2d \cdot (n_0 - n_i);$$

where $n_i$ represents the slicer error level at a specific index.

In an embodiment, the Forney error correction component 255 identifies "high confidence" decisions (e.g., in cases where there is no saturation or an invalid error index) that is equal to d or $d+n_i$.

Figure 3:
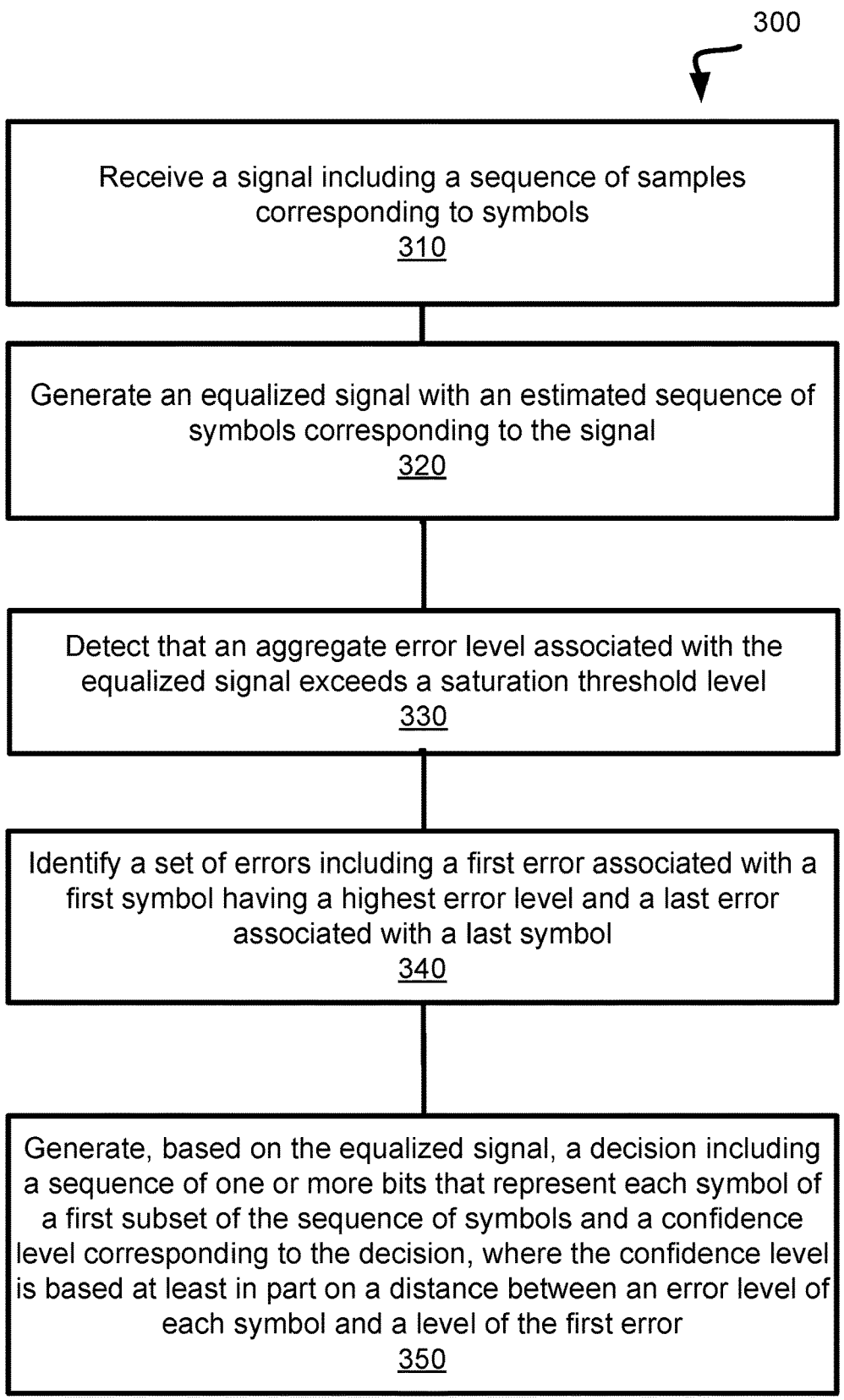
FIG. 3 is a flow diagram of a method of decoding a received digital signal to determine a hard-decision estimation corresponding to samples of the received digital signal with a corresponding Forney-based soft decision decoding to generate a confidence level that indicates a confidence or certainty for each hard decoded decision, in accordance with at least some embodiments.

FIG. 3 is a flow diagram of an example method 300 of decoding a received digital signal to determine a hard-decision estimation (e.g., a fixed set of possible values such as "0" or "1" in binary code) corresponding to samples of the received digital signal with a corresponding soft decision or confidence level (e.g., a number in a range of values) that indicates a confidence or certainty for each hard decoded decision (e.g., each symbol/bit) using a Forney-based approach, as described above. The method 300 can be performed by processing logic comprising hardware, software, firmware, or any combination thereof. In at least one embodiment, the method 300 is performed by the decision generation component 150 of FIGS. 1A, 1B, and 1C or the decision generation component 250 of FIG. 2. In at least one embodiment, the method 300 is performed by various components of the decision-generation components 150 and 250 to generate the hard-decoded bits and a corresponding soft-decoded confidence level for each of the bits of a received signal in a communication system, according to embodiments. According to embodiments, the method 300 can be performed by a receiver (e.g., a receiver device in a communications system) having a decision generation component, in accordance with the embodiments described herein with reference to a receiver-side decision generation component. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the digital signal receiver receives a signal, including a sequence of samples corresponding to symbols. In an embodiment, the signal can be transmitted in accordance with a suitable modulation scheme (e.g., PAM, QAM, etc.).

At operation 320, the digital signal receiver generates an equalized signal with an estimated sequent of symbols corresponding to the signal. In an embodiment, the equalized signal can be a partial response (e.g., a PR1 signal), including the original symbols with residual inter-symbol-interference (ISI).

At operation 330, the digital signal receiver detects that an aggregate error level associated with the equalized signal exceeds a saturation threshold level. In an embodiment, upon determining the aggregate error level reaches the error saturation point, an indicator (e.g., a flag) is generated and provided to (or is otherwise detectable) a Forney error correction component (e.g., Forney error correction component 255 of FIG. 2).

At operation 340, the digital receiver identifies a set of errors, including a first error associated with a first symbol having a highest error level and a last error associated with a last symbol. In an embodiment, the digital receiver identifies and removes the invalid errors to generate a subset of "valid" errors. As described above, the valid errors are sorted to generate an error vector with an ordering of samples of the identified "chunk" or set of errors from a highest error level to a lowest error level. In an embodiment, the last error associated with the last symbol corresponds to the saturation point (i.e., the point where the aggregate error level exceeds the saturation threshold level). In an embodiment, the set of errors is identified by a Forney error correction component (e.g., Forney error correction component 255 of FIG. 2) of the digital receiver.

At operation 350, the digital receiver generates, based on the equalized signal, a decision including a sequence of one or more bits that represent each symbol of a first subset of the sequence of symbols and a confidence level corresponding to the decision, where the confidence level is based at least in part on a distance between an error level of each symbol and a level of the first error. In an embodiment, the digital signal receiver includes a decision generation component configured to implement the Forney-based soft MLSE processing to calculate a state's log-likelihood probability vector for each input sample corresponding to the equalized signal (e.g., the partial response of the received digital signal), where each state probability corresponds to a possible symbol value corresponding to the partial response. For example, in a PR1 signal, there are 4 state probabilities that correspond to symbol values (−3, −1, 1, 3).

In an embodiment, the soft decision (e.g., LLR) for each sample is determined by executing an estimation (e.g., the Forney algorithm) on the symbol block using a Forney error correction component (e.g., Forney error correction component 255 of FIG. 2). According to embodiments, the LLR (e.g., the soft decision) for each symbol estimation (e.g., hard-decision estimation) is based on a distance (e.g., a difference) between a particular symbol's error level and a highest error level.

Figure 4:
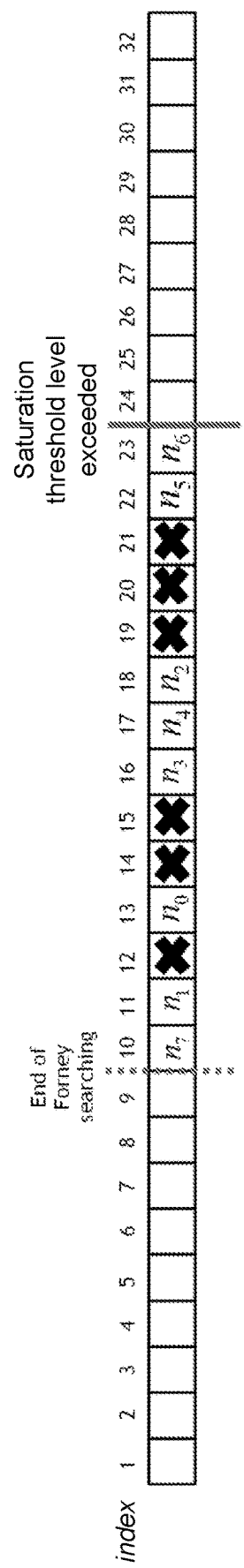
FIG. 4 illustrates an example set of errors detected using a Forney-based decision generation component to generate a hard decoded bit decision and a corresponding confidence level associated with a received signal, in accordance with at least some embodiments.

FIG. 4 illustrates an example portion of a received signal processed in accordance with the method 300 of FIG. 3. As shown in FIG. 4, a set of indices of samples (e.g., indices 1 through 32) is processed by a decision generation component (e.g., decision generation component 150 of FIGS. 1A-1C or decision generation component 250 of FIG. 2) in accordance with the Forney-based estimation process described in FIG. 3. In this example, the bolded X represents an invalid error that is removed or discarded from the Forney processing (e.g., indices 12, 14, 15, 19, 20, and 21). In FIG. 4, the distance (d) between the levels of the example shown is two (2). In this example, a PAM-4 signal is processed such that after a (1+1·D) channel the desired levels are {0, ±2, ±4, ±6}, where D is one unit-interval delay, such that PR1 is equal to (1+1D)^1, where the current channel's output is the current input's symbol plus the previous input's symbol.

In an embodiment, the Forney "window" stops in index 10 in view of a stop condition, where the error sign is expected to exhibit a zig-zag pattern (e.g., alternating positive/negative signs). In an example, if, based on the saturation sign, it is determined that at a specific index the error should be positive, a decision for the lowest level (e.g., '−3' for PAM4) is identified. In this example, the decision indicates that there is in an invalid error, since the positive error of '−3' is produced by a real '−5' symbol, which does not exist. Similarly, for a negative error and the highest level (e.g., '3' for PAM4), it is determined that there is no error. Accordingly, in this example, the Forney searching completes at index 10 due to this stop-condition.

In this example, the decision generation component executes the method 300 to determine that indices 1 through 9, index 12, index 14, index 15, indices 19-21, and indices 24-32 are identified as having a high confidence level (e.g., an LLR of 2). As indicated above, the invalid errors are identified as having a high confidence level. In an embodiment, applying the Forney-based processing illustrated in FIG. 3, the decision generation component determines a confidence level (LLR) corresponding to index 11 and index 13 in accordance with the following expression:

$$4 \cdot (n_0 - n_1);$$

where D (i.e., the distance between levels) equals 2 and 2D equals 4.

In this example, applying the Forney-based processing illustrated in FIG. 3, the decision generation component determines a confidence level (LLR) corresponding to the other indices (i) in accordance with the following expression:

$$4 \cdot (n_0 - n_i)$$

According to another embodiment, a Forney-based approach is performed to generate a confidence level in the event that the saturation point is not reached. In an embodiment, the saturation point may not be reached due to there not being any errors in the sequence or the presence of two or more errors (e.g., saturation does not occur since an additional opposite error (i.e., a second error) occurs prior to saturation due to a first error). As described above, when the partial response (e.g., PR1) enters into the 'error mode' (e.g., between error occurred up to the saturation), the error behaves in a zig-zag pattern (e.g., alternating positive and negative signs). For example, if the error is positive, and the first slicer has a negative error, it indicates that the propagated error and the current error cancel one another out. This results in exiting the error mode without any saturation and no indication is provided to 'turn on' the Forney correction block.

In an embodiment, to address the instance where the saturation point is not reached (no saturation), the decision generation component determines a first probability that the sequence includes two (2) errors ($P_{2\ errors}$) and a second probability that the sequence includes zero (0) errors ($P_{no\ errors}$).

In this embodiment, given that no saturation occurred, the first probability and second probability can be represented by the following expressions:

$$P_{2errors} = (d - n_{up_0})^2 + (d - n_{dn_0})^2$$

$$P_{noerrors} = n_{up_0}^2 + n_{dn_0}^2;$$

where $n_{up_0}$ is the highest error which can lead to a positive (up) error and $n_{dn_0}$ is the highest error which can lead to a negative (down) error.

According to this embodiment, the decision generation component generates a Forney-based soft decision (LLR) according to the following expression:

$$LLR_{0,1} = P_{2errors} - P_{noerrors} = 2d \cdot (d - n_{up_0} - n_{dn_0})$$

Figure 5:
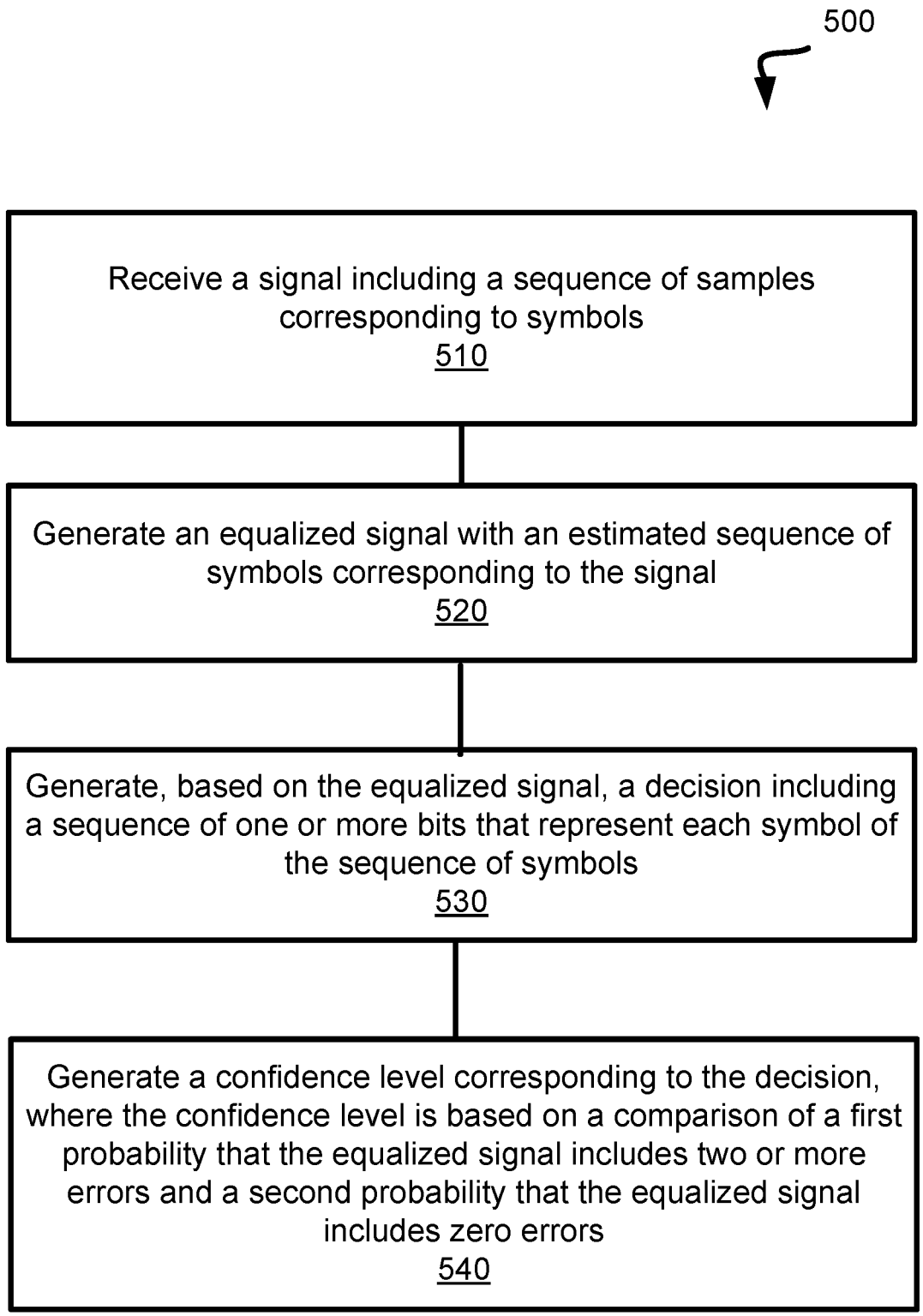
FIG. 5 is a flow diagram of a method of decoding a received digital signal to determine a hard-decision estimation corresponding to samples of the received digital signal with a corresponding Forney-based soft decision decoding to generate a confidence level that indicates a confidence or certainty for each hard decoded decision, in accordance with at least some embodiments.

FIG. 5 is a flow diagram of an example method 500 of decoding a received digital signal to determine a hard-decision estimation (e.g., a fixed set of possible values such as "0" or "1" in binary code) corresponding to samples of the received digital signal with a corresponding soft decision or confidence level (e.g., a number in a range of values) that indicates a confidence or certainty for each hard decoded decision (e.g., each symbol/bit) using a Forney-based approach for instances when an aggregate error level does not exceed an error saturation threshold, as described above. The method 500 can be performed by processing logic comprising hardware, software, firmware, or any combination thereof. In at least one embodiment, the method 500 is performed by the decision generation component 150 of FIGS. 1A, 1B, and 1C or the decision generation component 250 of FIG. 2. In at least one embodiment, the method 500 is performed by various components of the decision-generation components 150 and 250 to generate the hard-decoded bits and a corresponding soft-decoded confidence level for each of the bits of a received signal in a communication system, according to embodiments. According to embodiments, the method 500 can be performed by a receiver (e.g., a receiver device in a communications system) having a decision generation component, in accordance with the embodiments described herein with reference to a receiver-side decision generation component. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the digital signal receiver receives a signal, including a sequence of samples corresponding to symbols. In an embodiment, the signal can be transmitted in accordance with a suitable modulation scheme (e.g., PAM, QAM, etc.).

At operation 520, the digital signal receiver generates an equalized signal with an estimated sequent of symbols corresponding to the signal. In an embodiment, the equalized signal can be a partial response (e.g., a PR1 signal), including the original symbols with residual ISI At operation 530, the digital signal receiver generates, based on the equalized signal, a decision including a sequence of one or more bits that represent each symbol of the sequence of symbols.

At operation 540, the digital signal receiver generates a confidence level corresponding to the decision, where the confidence level is based on a comparison of a first probability that the equalized signal includes two or more errors and a second probability that the equalized signal includes zero errors. In an embodiment, as described and shown above, the confidence level for a given hard-decision estimation is determined based on a difference between the first probability (i.e., $P_{2\ errors}$) and the second probability (i.e., $P_{no\ errors}$). In an embodiment, the digital signal receiver includes a decision generation component configured to implement the Forney-based soft MLSE processing to calculate a state's log-likelihood probability vector for each input sample corresponding to the equalized signal (e.g., the partial response of the received digital signal), where each state probability corresponds to a possible symbol value corresponding to the partial response. For example, in a PR1 signal, there are 4 state probabilities that correspond to symbol values (−3, −1, 1, 3).

Figure 6:
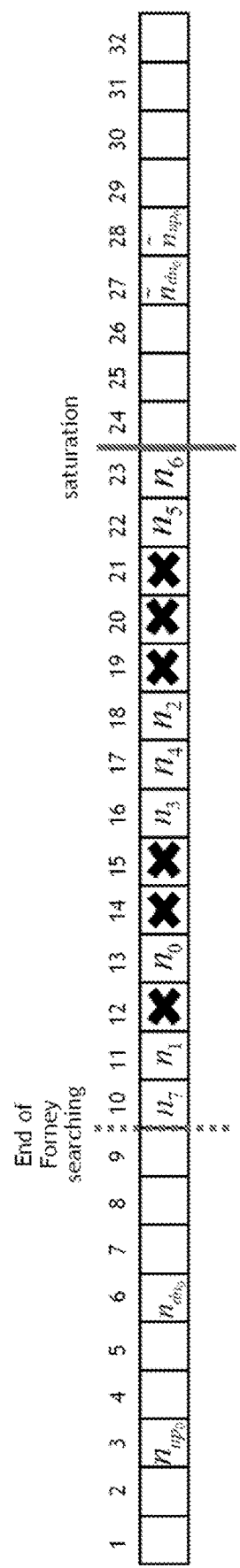
FIG. 6 illustrates an example set of errors detected using a Forney-based decision generation component to generate a hard decoded bit decision and a corresponding confidence level associated with a received signal, in accordance with at least some embodiments.

FIG. 6 illustrates an example portion of a received signal processed in accordance with the method 500 of FIG. 5. As shown in FIG. 6, a set of indices of samples (e.g., indices 1 through 32) are processed by a decision generation component (e.g., decision generation component 150 of FIGS. 1A-1C or decision generation component 250 of FIG. 2) in accordance with the Forney-based estimation process described in FIG. 5. In this example, the bolded X represents an invalid error that is removed or discarded from the Forney processing (e.g., indices 12, 14, 15, 19, 20, and 21).

In this example, indices 3 and 6 and indices 27 and 28 represent the highest error levels corresponding to valid errors, which can cause up and down errors such that no saturation occurs (e.g., a positive (up) error and a negative (down) error that cancel each other out, such that no indication of saturation is generated. In this example, a high confidence level is determined by the Forney processing for indices 1, 2, 4, 5, 7 through 9, 12, 14, 15, 19 through 21, 24 through 26, and 29 through 32. In this example, the Forney processing determines a confidence level for indices 3 and 6 according to the following expression:

$$LLR = 4 \cdot (2 - n_{up_o} - n_{dn_o});$$

where D equals 2 and 2D equals 4.

In this example, the Forney processing determines a confidence level for indices 11 and 13 according to the following expression:

$$LLR = 4 \cdot (n_o - n_1).$$

In this example, the Forney processing determines a confidence level for indices 27 and 28 according to the following expression:

$$LLR = 4 \cdot (2 - n_{up0} - n_{dn0})$$

In this example, the Forney processing determines a confidence level for the remaining indices shown in the example of FIG. 6 according to the following expression:

$$LLR = 4 \cdot (n_o - n_i)$$

Figure 7:
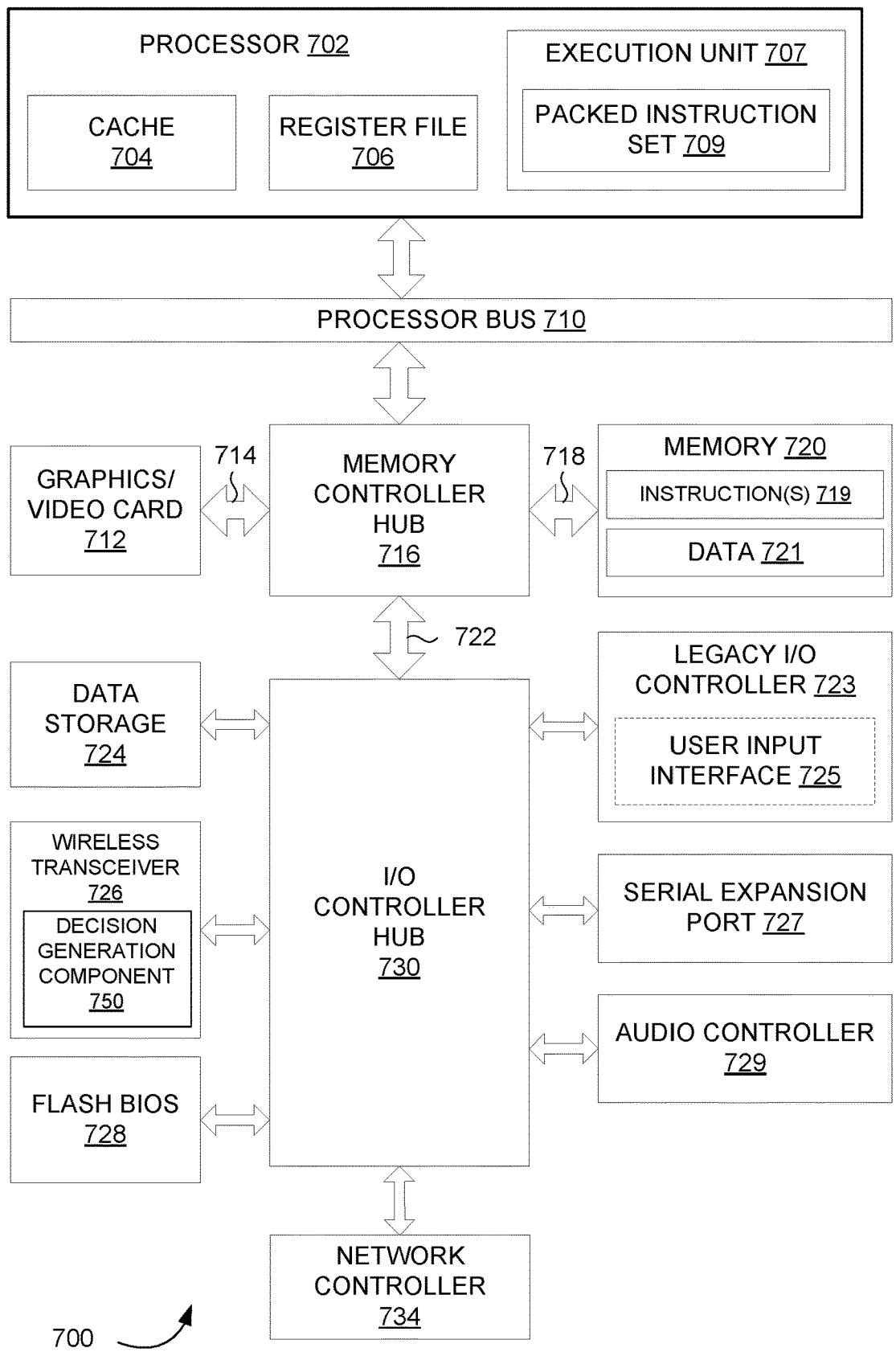
FIG. 7 illustrates an example computer system including a wireless transceiver including a Forney-based decision generation component, in accordance with at least some embodiments.

FIG. 7 illustrates a computer system 700, in accordance with at least one embodiment. In at least one embodiment, computer system 700 may be a system with interconnected devices and components, an SOC, or some combination. In at least one embodiment, computer system 700 is formed with a processor 702 that may include execution units to execute an instruction. In at least one embodiment, computer system 700 may include, without limitation, a component, such as processor 702, to employ execution units including logic to perform algorithms for processing data. In at least one embodiment, computer system 700 may include processors, such as PENTIUM® Processor family, Xeon™, Itanium®, XScale™ and/or StrongARM™, Intel® Core™, or Intel® Nervana™ microprocessors available from Intel Corporation of Santa Clara, California, although other systems (including PCs having other microprocessors, engineering workstations, set-top boxes and like) may also be used. In at least one embodiment, computer system 700 may execute a version of WINDOWS' operating system available from Microsoft Corporation of Redmond, Wash., although other operating systems (UNIX and Linux for example), embedded software, and/or graphical user interfaces may also be used.

In at least one embodiment, computer system 700 may be used in other devices, such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor (DSP), an SoC, network computers ("NetPCs"), set-top boxes, network hubs, wide area network ("WAN") switches, or any other system that may perform one or more instructions. In an embodiment, computer system 700 may be used in devices such as graphics processing units (GPUs), network adapters, central processing units and network devices such as switches (e.g., a high-speed direct GPU-to-GPU interconnect such as the NVIDIA GH100 NVLINK or the NVIDIA Quantum 2 64 Ports InfiniBand NDR Switch).

In at least one embodiment, computer system 700 may include, without limitation, processor 702 that may include, without limitation, one or more execution units 707 that may be configured to execute a Compute Unified Device Architecture ("CUDA") (CUDA® is developed by NVIDIA Corporation of Santa Clara, CA) program. In at least one embodiment, a CUDA program is at least a portion of a software application written in a CUDA programming language. In at least one embodiment, computer system 700 is a single processor desktop or server system. In at least one embodiment, computer system 700 may be a multiprocessor system. In at least one embodiment, processor 702 may include, without limitation, a CISC microprocessor, a RISC microprocessor, a VLIW microprocessor, a processor implementing a combination of instruction sets, or any other processor device, such as a digital signal processor, for example. In at least one embodiment, processor 702 may be coupled to a processor bus 710 that may transmit data signals between processor 702 and other components in computer system 700.

In at least one embodiment, processor 702 may include, without limitation, a Level 1 ("L1") internal cache memory ("cache") 704. In at least one embodiment, processor 702 may have a single internal cache or multiple levels of internal cache. In at least one embodiment, cache memory may reside external to processor 702. In at least one embodiment, processor 702 may also include a combination of both internal and external caches. In at least one embodiment, a register file 706 may store different types of data in various registers including, without limitation, integer registers, floating point registers, status registers, and instruction pointer register.

In at least one embodiment, execution unit 707, including, without limitation, logic to perform integer and floating point operations, also resides in processor 702. Processor 702 may also include a microcode ("ucode") read-only memory ("ROM") that stores microcode for certain macro instructions. In at least one embodiment, execution unit 707 may include logic to handle a packed instruction set 709. In at least one embodiment, by including packed instruction set 709 in an instruction set of a general-purpose processor 702, along with associated circuitry to execute instructions, operations used by many multimedia applications may be performed using packed data in a general-purpose processor 702. In at least one embodiment, many multimedia applications may be accelerated and executed more efficiently by using full width of a processor's data bus for performing operations on packed data, which may eliminate a need to transfer smaller units of data across a processor's data bus to perform one or more operations one data element at a time.

In at least one embodiment, an execution unit may also be used in microcontrollers, embedded processors, graphics devices, DSPs, and other types of logic circuits. In at least one embodiment, computer system 700 may include, without limitation, a memory 720. In at least one embodiment, memory 720 may be implemented as a DRAM device, an SRAM device, flash memory device, or other memory devices. Memory 720 may store instruction(s) 719 and/or data 721 represented by data signals that may be executed by processor 702.

In at least one embodiment, a system logic chip may be coupled to processor bus 710 and memory 720. In at least one embodiment, the system logic chip may include, without limitation, a memory controller hub ("MCH") 716, and processor 702 may communicate with MCH 716 via processor bus 710. In at least one embodiment, MCH 716 may provide a high bandwidth memory path 718 to memory 720 for instruction and data storage and for storage of graphics commands, data and textures. In at least one embodiment, MCH 716 may direct data signals between processor 702, memory 720, and other components in computer system 700 and to bridge data signals between processor bus 710, memory 720, and a system I/O 722. In at least one embodiment, a system logic chip may provide a graphics port for coupling to a graphics controller. In at least one embodiment, MCH 716 may be coupled to memory 720 through a high bandwidth memory path 718, and graphics/video card 712 may be coupled to MCH 716 through an Accelerated Graphics Port ("AGP") interconnect 714.

In at least one embodiment, computer system 700 may use system I/O 722 that is a proprietary hub interface bus to couple MCH 716 to I/O controller hub ("ICH") 730. In at least one embodiment, ICH 730 may provide direct connections to some I/O devices via a local I/O bus. In at least one embodiment, a local I/O bus may include, without limitation, a high-speed I/O bus for connecting peripherals to memory 720, a chipset, and processor 702. Examples may include, without limitation, an audio controller 729, a firmware hub ("flash BIOS") 728, a wireless transceiver 726, a data storage 724, a legacy I/O controller 723 containing a user input interface 725 and a keyboard interface, a serial expansion port 727, such as a USB, and a network controller 734. Data storage 724 may comprise a hard disk drive, a floppy disk drive, a CD-ROM device, a flash memory device, or other mass storage device. In an embodiment, the wireless transceiver 726 includes a decision generation component 750 (e.g., the decision generation component 150 of FIGS. 1A-1C and 250 of FIG. 2).

In at least one embodiment, FIG. 7 illustrates a system, which includes interconnected hardware devices or "chips." In at least one embodiment, FIG. 7 may illustrate an exemplary SoC. In at least one embodiment, devices illustrated in FIG. 7 may be interconnected with proprietary interconnects, standardized interconnects (e.g., PCIe), or some combination thereof. In at least one embodiment, one or more components of system 700 are interconnected using compute express link ("CXL") interconnects.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code, while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to actions and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. As non-limiting examples, a "processor" may be a network device or a MACsec device. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as the system may embody one or more methods and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A digital receiver comprising:
   an equalization component to:
      receive a signal comprising a sequence of symbols; and
      generate an equalized signal with an estimated sequence of symbols corresponding to the signal; and
   a decision generation component to:
      detect that an aggregate error level associated with the equalized signal exceeds a saturation threshold level;
      identify a set of errors comprising a first error associated with a first symbol having a highest error level and a last error associated with a last symbol; and
      generate, based on the equalized signal, a decision comprising a sequence of one or more bits that represent each symbol of a first subset of the sequence of symbols and a confidence level corresponding to the decision, wherein the confidence level is based at least in part on a distance between an error level of each symbol and a level of the first error.

2. The digital receiver of claim 1, the decision generation component further to execute a Forney algorithm to:
   determine a first location of the first error in the set of errors; and
   determine a second location of the last error in the set of errors.

3. The digital receiver of claim 2, wherein the second location of the last error corresponds to a point where the aggregate error level exceeds the saturation threshold level.

4. The digital receiver of claim 1, the decision generation component further to execute a Forney algorithm to identify the first subset of the sequence of symbols associated with valid errors.

5. The digital receiver of claim 4, the decision generation component further to execute the Forney algorithm to identify a second subset of the sequence of symbols associated with invalid errors.

6. The digital receiver of claim 5, the decision generation component further to:
   remove the second subset of invalid errors from the set of errors; and
   determine a set of error levels associated with the first subset of valid errors.

7. The digital receiver of claim 6, the decision generation component further to:
   compare each error level of the set of error levels to determine the highest error level corresponds to the first error associated with the first symbol.

8. The digital receiver of claim 1, the decision generation component further to identify a flag associated with the aggregate error level exceeding the saturation threshold level.

9. The digital receiver of claim 1, wherein the confidence level comprises a log-likelihood ratio corresponding to the sequence of one or more bits that represent each symbol of the first subset of the sequence of symbols.

10. A method comprising:
receiving a signal comprising a sequence of symbols;
generating an equalized signal with an estimated sequence of symbols corresponding to the signal;
detecting that an aggregate error level associated with the equalized signal exceeds a saturation threshold level;
identifying a set of errors comprising a first error associated with a first symbol having a highest error level and a last error associated with a last symbol; and
generating, based on the equalized signal, a decision comprising a sequence of one or more bits that represent each symbol of a first subset of the sequence of symbols and a confidence level corresponding to the decision, wherein the confidence level is based at least in part on a distance between an error level of each symbol and a level of the first error.

11. The method of claim 10, further comprising executing a Forney algorithm to:
determine a first location of the first error in the set of errors; and
determine a second location of the last error in the set of errors.

12. The method of claim 11, wherein the second location of the last error corresponds to a point where the aggregate error level exceeds the saturation threshold level.

13. The method of claim 10, further comprising executing a Forney algorithm to identify the first subset of the sequence of symbols associated with valid errors.

14. The method of claim 13, further comprising executing the Forney algorithm to identify a second subset of the sequence of symbols associated with invalid errors.

15. The method of claim 14, further comprising:
removing the second subset of invalid errors from the set of errors;
determine a set of error levels associated with the first subset of valid errors; and
comparing each error level of the set of error levels to determine the highest error level corresponds to the first error associated with the first symbol.

16. The method of claim 10, further comprising identifying a flag associated with the aggregate error level exceeding the saturation threshold level.

17. The method of claim 10, wherein the confidence level comprises a log-likelihood ratio corresponding to the sequence of one or more bits that represent each symbol of the first subset of the sequence of symbols.

* * * * *